June 13, 1967 V. F. DAHLGREN ET AL 3,325,691

FLEXIBLE PRINTED CIRCUITRY TERMINATIONS

Filed July 9, 1965 2 Sheets-Sheet 1

INVENTORS:
VICTOR F. DAHLGREN
SIDNEY K. TALLY
THOMAS H. STEARNS
BY
Brumbaugh, Free, Graves & Donohue
THEIR ATTORNEYS INVENTORS:
VICTOR F. DAHLGREN
SIDNEY K. TALLY
THOMAS H. STEARNS
BY
Brumbaugh, Free, Graves & Donohue
THEIR ATTORNEYS

United States Patent Office 3,325,691

Patented June 13, 1967

3,325,691

FLEXIBLE PRINTED CIRCUITRY TERMINATIONS

Victor F. Dahlgren, Chelmsford, Mass., and Sidney K. Tally, Nashua, and Thomas H. Stearns, Amherst, N.H., assignors to Electro-Mechanisms, Inc., Methuen, Mass., a corporation of New Hampshire Filed July 9, 1965, Ser. No. 470,685
10 Claims. (Cl. 317—101)

This invention relates to methods of applying terminals to flexible printed circuits and the resulting products, and is an improvement in the methods and products disclosed in our co-pending application Ser. No. 281,273 filed May 17, 1963 now Patent No. 3,264,524.

The techniques of making printed circuits for use in the electronics field are well known. Printed circuits are made usually by adhering a copper foil to a supporting base of insulating material, applying a resist to the foil to cover the areas of the conductors to be formed in the circuit and etching away the exposed metal.

As described in our co-pending application, Ser. No. 281,273, now Patent No. 3,264,524, a cover layer of an electrically insulating plastic may be applied to the exposed surface of the copper foil and united with the insulating base to form either a relatively rigid member containing one or more layers of such conductors or flexible flat cables, depending upon the type of plastic or plastic reenforcements used in the insulating base and cover. In the rigid bases, thin layers of glass fiber fabrics are commonly used, while in the flexible cables or circuits, the rigidifying fabric is omitted and the insulating layers of flexible plastic are thermally bonded or cemented together to encapsulate the conductors.

Inasmuch as the conductors of the printed circuit are formed of foil-like copper and the insulating or encapsulating layers of plastic interfere with metal-to-metal contact, difficulty has always been encountered in providing suitable terminals therefor. Moreover, such flexible printed circuits are used in complex electronic equipment wherein failure of a relatively small part, such as breakage of a conductor or separation of a terminal from a conductor may result in the loss or inoperativeness of equipment of extremely costly nature. Accordingly, inspection of these circuits is very thorough and very critical causing rejection of parts for minor defects which have no real effect on the operativeness of the cable or flexible printed circuit. Thus, surface marring, slight defects in the insulating covers as, for example, by inclusion of air bubbles, and discoloration of the foil-like conductors, are all reasons for rejection of a flexible printed circuit or a conductor.

In accordance with the present invention, methods of applying terminals to flexible or rigid printed circuits or combinations of them are provided whereby terminals of uniformly high quality can be attached to printed circuit conductors without damage to or even marring of the resulting product so that the product is readily inspected and is capable of withstanding the exacting conditions of use to which these products are subjected.

More particularly, in accordance with the present invention, a method is provided whereby tubelets or eyelets having a surface coating of a high temperature brazing metal, such as a silver brazing alloy having a melting point of 800° F. or higher can be united to each other and to a foil-like conductor of a printed circuit without damage to the conductor or to the encapsulating plastic. The method involves procedural steps whereby terminals having exposed surfaces of substantial area for connecting other equipment or conductors thereto can be applied to single or multi-layer printed circuits in such a manner that a mechanically strong, electrically conductive fillet is formed between the eyelets and the conductors, thereby preventing interruption of the circuit at the terminal other than by the application of such strong forces thereto as would actually damage the circuit and the foil-like conductors in the circuit.

For a better understanding of the present invention, reference may be had to the accompanying drawings, in which.

Inasmuch as flexible printed circuits are used under various service conditions where failure would be costly and where inspection is vital to determine whether the printed circuit is correctly made, the insulating material in which the thin foil conductors 10 formed by etching or otherwise is embedded is preferably transparent and can be formed of such materials as Teflon (polytetrafluoroethylene), polyurethane plastics, polyester plastics and the like. For example, two layers and 11 and 12 about .002 to .010 inch thick of a polyurethane plastic are cemented or bonded by heat and pressure to the opposite sides of the foil-like conductors 10 to form a transparent flexible cable or printed circuit in which the several conductors are clearly visible. The conductors 10 were formed on one of the layers 11 or 12 by etching in the usual way. In a typical cable C, the encapsulating plastic may be a polyurethane plastic sold by Conap, Inc., and disclosed in Conap, Inc., Bulletin U-1500-1, and identified as 2000/AH-3. This resin is a two component resin requiring a four-hour cure at 100° C. When cured, the resin has a Shore R Hardness of 80 and an elongation of 150%, a tensile strength of 1300, water absorption of 1.1% on twenty-four hour immersion, electrical dissipation factor at 25° C. of 0.08 and a dielectric constant of 4.6. It also has a Brookfield viscosity at 25° C. of 9000, and at 80° C. of 300. Another suitable polyurethane resin is Bonner No. 7021 manufactured by Bonner Chemicals Division of Bay State Chemical Co., Inc. The use of these resins and similar resins produces an insulating base of a desired thinness and durability as well as having other properties of a desired nature. Other suitable polyurethanes as well as such polyester resins as Mylar are useful.

Figures 1, 2, 3, 4, 5, 6, 7, 8:
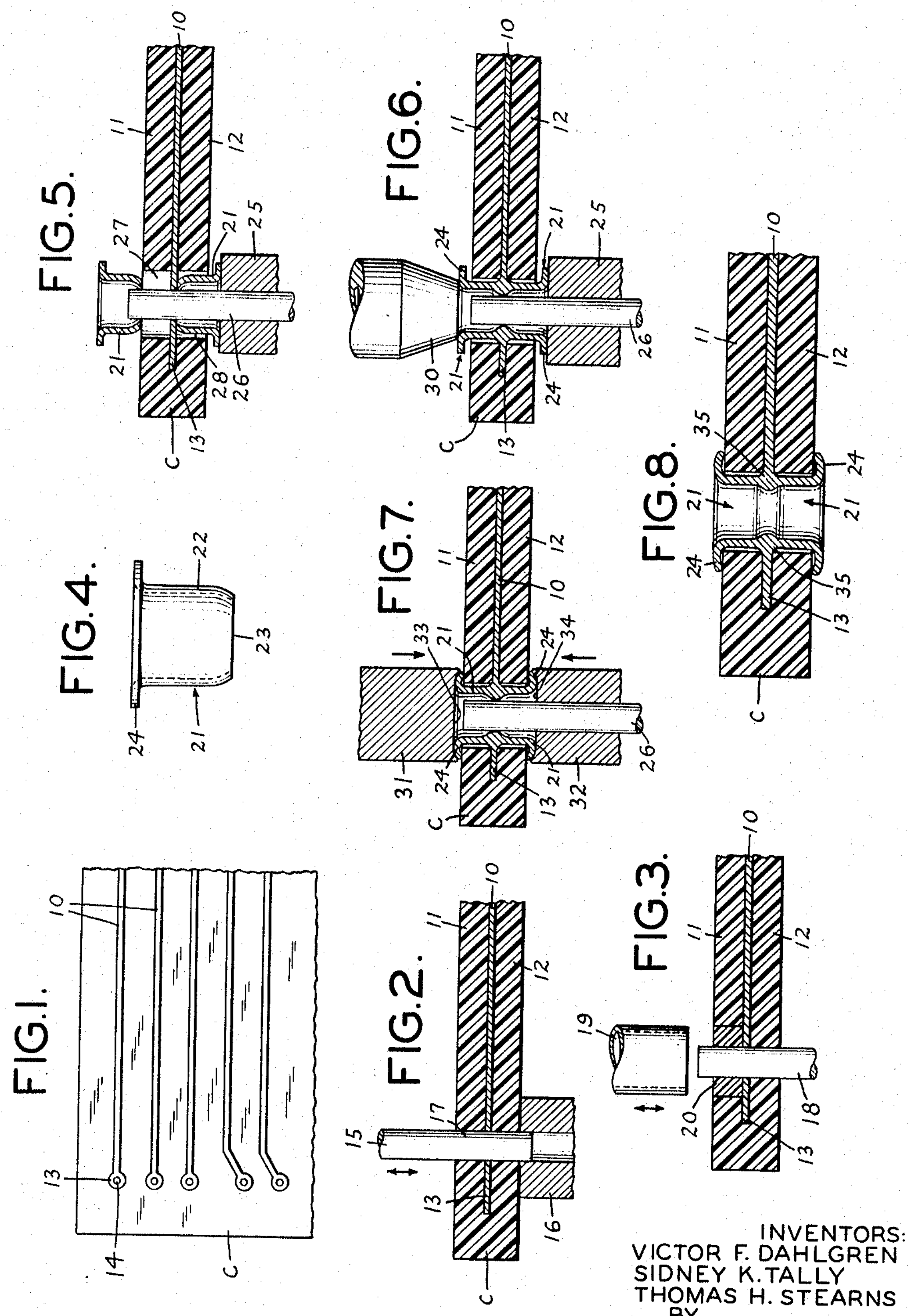
FIGURE 1 is a plan view of a portion of a typical flexible printed circuit prior to the application of terminals thereto.
FIGURE 2 is a cross-sectional view of the printed circuit illustrating the punching of a hole through the circuit member and a conductor therein.
FIGURE 3 is a cross-sectional view illustrating the removal of a portion of the insulation overlying the conductor in a flexible printed circuit.
FIGURE 4 is a cross-sectional view of a typical eyelet or tubelet forming a part of the terminal for the printed circuit.
FIGURE 5 illustrates the insertion of the tubelets and positioning thereof in the printed circuit.
FIGURE 6 illustrates the welding of a pair of tubelets together to form a terminal.
FIGURE 7 is a cross-sectional view on somewhat larger scale illustrating the rolling of the flanges of the tubelets to complete the terminal.
FIGURE 8 is a view in cross-section on still larger scale illustrating a finished terminal for a conductor in the printed circuit in accordance with the present invention.

The encapsulting plastic overlies rounded or otherwise shapeds pads 13 at the ends of the conductors where a terminal is to be attached. In accordance with the present invention, the pads are partially exposed to apply the terminal in the following manner. As shown in FIGURE 1, the plastic is indented as at 14 by means of a suitable punch to serve as a guide mark. Due to the small size of the conductors, indenting and the following operations are conducted with a microscope or magnifier. After the indentation 14 is formed in the plastic, the printed circuit, hereinafter referred to as a cable C, is transferred to a punching device where the indentation 14 is centered between a punch 15 and a cooperating die member 16 and the punch is actuated to punch a hole 17 through the plastic layers and the center of the pad 13 on the conductor 10.

The hole 17 is used as a centering means to receive a vertically reciprocable pin 18 on another punching apparatus which is provided with a tubular punch 19 which is moved into engagement with the cable C to cut a small annular ring or divot 20 out of the plastic overlying the pad 13. After the ring 20 has been cut, it can be removed to expose a portion of the surface of the pad 13 around the opening 17 in the pad 13. The cable is then turned over and a similar ring or divot is cut out of the opposite side of the cable C to expose both sides of the pad 13.

Removal of the divots is not necessary with all types of plastic insulation. Plastics which melt rather than char, for example, do not require divotting.

The terminals for the various conductors 10 are suitably formed of small eyelets or tubelets 21 of the type shown in FIGURE 4. These tubelets preferably are formed of copper and have thin, generally cylindrical walls 22 which are turned in slightly at the inner end 23 and provided with a generally flat outturned flange 24 at the outer end thereof. The outer diameter of the walls 22 can be between about .020 and .250 inch, the size depending on the spacing between and the size of the pads 13 on the conductors. The underside of the flange and the outer surface of the copper tubelet 21 are provided with a coating about 1 to 2 mils thick of a silver brazing alloy having a melting point of at least 800° F.

Suitable brazing alloys are the following Handy & Harman alloys:

| | Composition | Melting Point, ° F. | Flow Point, ° F. |
|---|---|---|---|
| Sil Fos | 15% Ag, 80% Cu, 5% P | 1,185 | 1,300 |
| 603 | 60% Ag, 30% Cu, 10% Sn | 1,115 | 1,325 |
| BT | 72% Ag, 28% Cu | 1,435 | 1,435 |
| Premabraze 615 | 61.5% Ag, 24% Cu, 14.5% In | 1,155 | 1,305 |

Other similar brazing alloys also are suitable.

Referring now to FIGURE 5, the cable C is positioned between the electrodes of a 110 volt A.C. spot welder having a lower flat-faced copper electrode 25 and a vertically reciprocable aligning pin 26 movable axially of the electrode 25. The welder may be provided with suitable taps to supply voltages in approximately equal steps between about 1.05 and 1.6 volts. The welder also has a timer to supply pulses of welding current of a desired duration.

With the pin 26 raised, an eyelet 21 is placed over the pin with the flange 24 against the electrode 25. The cable C is then placed over the pin 26 with the hole 17 receiving the pin 26 and another tubelet 21 also placed over the pin in the space left by removal of the divot 20 from the encapsulating plastic. As shown in FIGURE 5, the tubelets 21 are essentially the same diameter at their opposing ends 23 as the diameter of the opening 17 punched in the pad 13 and the outside diameter of the tubelet body 22 is slightly larger than the opening 17. The openings 27 and 28 formed by removal of the divots are of larger diameter than and out of contact with the body 22 of the tubelet but smaller than the diameter of the flange 24 of the tubelets. With the tubelets positioned in the cable C and the pin 26 raised, the upper electrode 30 of the welder is pressed with only suffcient pressure, up to 5 lbs. total force, to establish contact between the upper and lower tubelets without deforming them when they are heated to brazing temperature, e.g. 1300° F. to 1500° F., and the interposed pad 13 and a pulse of 60 cycle alternating current of only a few cycles duration (e.g., 10 to 15 cycles) is passed between the electrodes, thereby melting the brazing metal on the eyelets and brazing them together and to the pad 13 of the conductor. As explained in our co-pending application Ser. No. 281,273, the inclusion of a polyurethane cement or formation of the layers 11 and 12 of a transparent polyurethane plastic or other plastic that vaporizes at brazing temperature (1300 to 1500° F.) aids in fluxing the brazed connection and avoids charring so that a mechanically strong and electrically conductive joint is provided between the tublets 21 and the pad 13 of the conductor.

Following brazing and cooling, the flanges 24 of the tubelets may be rolled into contact with the encapsulating layers 11 and 12 by means of upper and lower punches 31 and 32 having concave die surfaces 33 and 34 thereon, as shown in FIGURE 7. Inasmuch as some variation in the thickness of the cable C and the dimensions of the tubelets occurs, the terminals (brazed tubelets) are not compressed to a predetermined lengthwise dimension but their flanges 24 are compressed against the surfaces of the cable C by forcing the die members 31 and 32 together with a uniform predetermined pressure. In this way, domed heads of substantial area are formed on the tubelets to which other conductors can be readily soldered or into which the ends of the conductors can be inserted and soldered.

FIGURE 8 discloses on greatly enlarged scale a typical brazed connection. The upper and lower tubelets 21 are brazed together at their adjacent ends and the pad 13 of the conductor 10 is joined by means of a well formed peripheral fillet 35 to both of the tubelets, thereby producing essentially a unitary terminal. The flanges 24 of the tubelets embrace the encapsulating layers 10 and 11 so that good moisture resistance is obtained therewith.

While the process described above has been directed to the connection of terminals to a single layer of conductors in a flexible cable C, it will be understood that the same procedures may be followed for joining together a plurality of cables or making connections in a multi-layer printed circuit composed of a plurality of layers of conductors separated by insulating encapsulating plastic.

Figure 9:
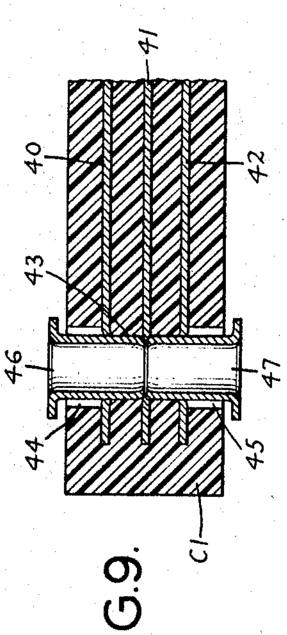
FIGURE 9 is a view in cross-section illustrating the use of the tubelets for making connections in a multi-layer printed circuit.

FIGURE 9 shows a flexible cable or printed circuit C1 including three layers of conductors 40, 41 and 42 separated by and encapsulated in insulating plastic. In the manner described above, a hole 43 is punched through the cable C and recesses 44 and 45 are formed in opposite surfaces thereof by removing the divots in the manner shown in FIGURE 3. However, removal of divots to form recesses in the outer layers of non-flexible or "hard" multilayer boards in non-charring plastics is not necessary. Thereafter, tubelets 46 and 47 similar to, but longer than, the tubelet 21 shown in FIGURE 4 are pushed into the hole 43 until they come in contact with each other. The hole 43 which is punched in the cable is of slightly smaller diameter than the outside of the diameters of the tublelets to insure intimate mechanical contact between the conductors 40 to 42 and the tubelets 46 and 47. Thereafter, the tubelets are subjected to a welding cycle sufficient to melt the brazing alloy but not the tubelets and braze them to each other and to the conductors 40 to 42 with which they are in contact.

Figure 10:
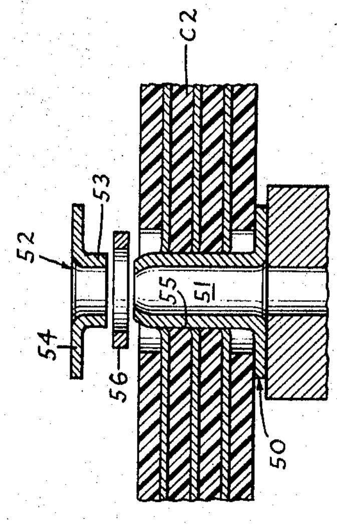
FIGURE 10 is a view in cross-section illustrating the use of tubelets of different form in making connections in a multi-layer printed circuit.

FIGURE 10 illustrates another type of tubelet which can be used for forming a terminal for a multi-layer type of printed circuit. The lower tubelet 50 has a generally cylindrical hollow body portion 51 of a length suffcient to extend substantially through the cable C2 and is externally coated with a silver brazing alloy of the type described above. The upper tubelet 52 has a short body 53 and a wide flange 54. The tubelet 50 is inserted through the opening 55 punched in the cable C2 and a ring of the brazing alloy 56 is placed around its upper end. The upper tubelet 52 is then pressed into contact with the upper end of the tubelet 50 and a pulse of welding current is passed through the tubelets to fuse the ring 56 and the brazing alloy on the surfaces of the tubelets and unite them into a unitary terminal which is also united to the conductors in the cable by brazed fillets as described above.

Although enlarged recesses formed by the removal of divots are illustrated in FIGURE 10, they are not necessary in "hard" multi-layer circuits as indicated above or in plastics that do not char.

Figure 11:
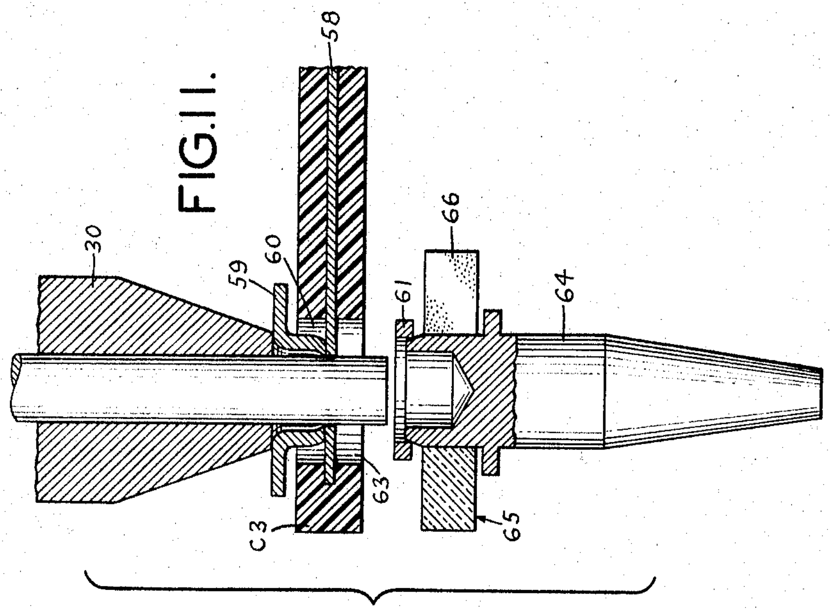
FIGURE 11 is an exploded view in cross-section showing the assembly of a terminal of different form with a single layer flexible printed circuit.

FIGURE 11 illustrates the connection of a taper pin connector or terminal to a flexible printed circuit or cable C3 having one or more layers of foil conductors 58 therein. The cable is punched and divots removed, as shown in FIGURES 2 and 3, and a tubelet 59 of suitable dimensions corresponding to the size of the hole 60 punched in the conductor is introduced into the cable C3. A ring of brazing metal 61 is introduced into the cavity 63 and a pin-type terminal 64 with a radially slotted washer 65 of ceramic material is pressed against the ring 61 and the end of the tubelet 59 after which a welding current is passed through the pin 64, the tubelet 59 and the ring 61, thereby melting the ring 61 and the brazing metal on the surface of the tubelet and uniting the pin 64 to the conductor and the tubelet. The washer 65 mounted on the pin 64 is provided with a radial slot or gap 66 to enable inspection of the joint between the pin 64, the tubelet 59 and the conductor 58. If the ring 65 were not provided with such an inspection opening, the soundness of the joint could not be determined.

Figure 12:
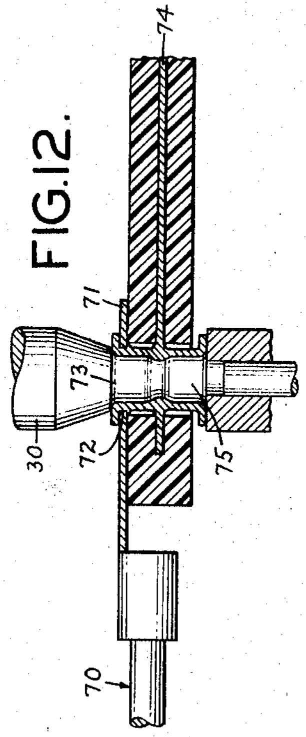
FIGURE 12 illustrates the attachment of still another form of terminal to a single layer printed circuit.

Still another type of terminal connection is illustrated in FIGURE 12. In this operation, a pin type terminal 70 is provided with a flat blade 71 having an opening 72 therein for receiving an upper tubelet 73 which is brazed to the conductor 74 and a lower tubelet 75 in the manner described above. With this operation and using tubelets having a brazing alloy coating, the blade 71 on the pin 70 need not be provided with a brazing alloy.

The welding electrodes which are used in the welding operations may be of different types. Usually, both of the electrodes are formed of copper having tapered ends although a flatfaced or even concave electrode can be used in some circumstances. However, inasmuch as the temperature during the brazing operation approaches very close to the fusion temperature of the copper of the tubelets, it is desirable to concentrate the heating zone by means of a taper point electrode and also conduct heat away after termination of the brazing operation as quickly as possible. In this way charring or unnecessary melting of the encapsulating plastic and discoloration of the copper are avoided and a joint is formed which can be easily inspected for formation of a fillet assuring the high mechanical strength and high electrical conductivity of the connection.

As mentioned above, the tubelets and terminals which are associated with the flexible cables described above are of extremely small size and the operations which are described above are conducted with the use of magnifying devices such as low power microscopes and the like. The parts usually must be handled with tweezers to assemble them properly. For that reason, the aligning means, such as the aligning pins described above on which the tubelets and cables are assembled, are most important in properly locating the several parts with respect to each other and with respect to the centers of the pads on the conductors to avoid fracturing or damaging the conductors and marring of the cables during the assembling and brazing operations. When the parts are manipulated in the manner described above, a very high degree of uniformity in the terminals is assured, and in all cases, the connections can be readily inspected because of the transparency of the cable.

It will be understood, of course, that the same type of terminals can be applied to other thicker conductors than those described above, but their preferred field of use is in printed circuits where the application of terminals to foil-like conductors has heretofore presented great difficulties and has been a very costly and time-consuming operation.

It will be understood that the terminals described above and the procedural steps of the method are susceptible to modification and accordingly, the invention is limited only as defined in the following claims.

We claim:

1. Terminals for printed circuit components having flexible, foil-like conductors encapsulated in insulating plastic comprising tubelets extending from opposite sides of said printed circuit through said insulating plastic, at least one of said tubelets engaging a conductor, said tubelets being brazed to each other and to said conductor with a brazing metal having a melting point of at least 800° F., said tubelets having flanges at their outer ends disposed adjacent to the opposite outer surfaces of said plastic and rolled with substantially uniform pressure to compensate for variations in thickness of said printed circuit component.

2. The terminals set forth in claim 1 in which one of said tubelets is longer than the other and extends through said conductor into engagement with the other tubelet.

3. The terminals set forth in claim 1 comprising a pin-like connector on one of said tubelets.

4. The terminals set forth in claim 1 comprising a pin-like connector having a blade portion thereon brazed to the flange of one of said tubelets.

5. A method of applying a terminal to a printed circuit having at least one foil-like conductor encapsulated in insulating plastic comprising punching a hole through said plastic and conductor, inserting tubelets into said hole to engage at least one of said tubelets with said conductor and to engage said tubelets with each other, said tubelets having flanges at their outer ends of greater diameter than said holes, said tubular bodies having a surface coating of brazing alloy with a melting point of at least 800° F., engaging said flanges of said tubelets with the electrodes of a welding apparatus and pressing said tubelets together and passing a current through said tubelets to heat said tubelets and melt said brazing alloy and braze said tubelets and conductor together, said pressure applied by said electrodes being sufficient to establish a conducting path through said tubelets and insufficient to deform said tubelets axially at the temperature to which said tubelets are heated.

6. The method set forth in claim 5 comprising rolling said flanges of said tubelets, after brazing, with uniform pressure to compensate for variations in thickness of said printed circuit.

7. The method set forth in claim 5 in which at least one of said electrodes is tapered and has a flat end.

8. A method of applying terminals to and connecting a plurality of printed circuit components, each having at least one foil-like conductor encapsulated in layers of insulating plastic, comprising assembling a stack containing a plurality of said components with at least portions of said conductors in superposed relation, punching a hole through the encapsulating plastic and superposed portions of said conductors, removing plastic around said hole from the outermost layers of plastic of said stack to form enlarged recesses therein, inserting tubelets into said recesses and hole from opposite sides of said stack to engage said tubelets with each other and said conductors, said tubelets having peripheral flanges at their outer end of greater diameter than said recesses and tubular bodies smaller than said recesses and at least as large as said hole, said tubular bodies having an external surface coating of a brazing alloy with a melting point of at least 800° F., engaging said flanges of said tubelets with the electrodes of a welding apparatus and pressing said tubelets together and passing a current through said tubelets to heat said tubelets and melt said brazing alloy and braze said tubelets and conductors together, said pressure applied by said electrodes being sufficient to establish a conducting path through said tubelets and insufficient to deform said tubelets axially at the temperature to which said tubelets are heated.

9. The method set forth in claim 8 comprising rolling said flanges of said tubelets, after brazing, with uniform pressure to compensate for variations in thickness of said printed circuit.

10. The method set forth in claim 8 in which at least one of said electrodes is tapered and has a flat end.

No references cited.

ROBERT K. SCHAEFER, *Primary Examiner*.

J. R. SCOTT, *Assistant Examiner*.